United States Patent
Uchida et al.

(10) Patent No.: US 8,853,678 B2
(45) Date of Patent: Oct. 7, 2014

(54) ORGANIC EL ELEMENT, METHOD FOR MANUFACTURING THE SAME, AND ORGANIC EL DISPLAY DEVICE

(75) Inventors: Hideki Uchida, Osaka (JP); Emi Yamamoto, Osaka (JP); Kazuya Nitta, Saitama (JP); Yasumasa Nakamura, Saitama (JP)

(73) Assignees: Sharp Kabushiki Kaisha, Osaka (JP); Fuence Co., Ltd., Saitama (JP)

( * ) Notice: Subject to any disclaimer, the term of this patent is extended or adjusted under 35 U.S.C. 154(b) by 252 days.

(21) Appl. No.: 13/381,349

(22) PCT Filed: Jun. 11, 2010

(86) PCT No.: PCT/JP2010/003899
§ 371 (c)(1),
(2), (4) Date: Dec. 28, 2011

(87) PCT Pub. No.: WO2011/001613
PCT Pub. Date: Jan. 6, 2011

(65) Prior Publication Data
US 2012/0104429 A1    May 3, 2012

(30) Foreign Application Priority Data
Jul. 2, 2009   (JP) ................ 2009-157442

(51) Int. Cl.
H01L 29/08 (2006.01)
H05B 33/26 (2006.01)
H01L 51/00 (2006.01)
H05B 33/10 (2006.01)
H01L 51/50 (2006.01)

(52) U.S. Cl.
CPC ............ *H01L 51/0003* (2013.01); *H05B 33/26* (2013.01); *H01L 51/5012* (2013.01); *H01L 51/5048* (2013.01); *H05B 33/10* (2013.01)
USPC ..................... 257/40; 257/E51.022

(58) Field of Classification Search
CPC .................................................... H01L 51/0545
USPC .............................................. 257/40, E51.022
See application file for complete search history.

(56) References Cited

U.S. PATENT DOCUMENTS 6,350,609 B1   2/2002   Morozov et al.
6,787,313 B2   9/2004   Morozov et al.
(Continued)

FOREIGN PATENT DOCUMENTS

EP    0982974 A1    3/2000
JP    2000-106278 A    4/2000
(Continued)

OTHER PUBLICATIONS

International Search Report received for PCT Patent Application No. PCT/JP2010/003899, mailed on Sep. 7, 2010, 5 pages. (2 pages of English Translation and 3 pages of PCT Search Report).

*Primary Examiner* — Matthew Reames
(74) *Attorney, Agent, or Firm* — Morrison & Foerster LLP

(57) ABSTRACT

An organic EL element includes a substrate 20, a lower electrode 21, an upper electrode 26, and an organic layer 22. The organic layer 22 is provided between the upper and lower electrodes 21, 26. The upper and lower electrodes 21, 26 and the organic layer 22 are stacked on the substrate 20. A hole injection layer 23 and a light emitting layer 24 in the organic layer 22 are formed by using an electrospray method, and have a film-like structure in which fine particles are continuously bonded together.

9 Claims, 11 Drawing Sheets

(56) References Cited

U.S. PATENT DOCUMENTS

| | | |
|---|---|---|
| 2001/0017409 A1 | 8/2001 | Hiroki et al. |
| 2002/0031874 A1 | 3/2002 | Yamazaki et al. |
| 2004/0077113 A1 | 4/2004 | Yamazaki et al. |
| 2004/0171182 A1 | 9/2004 | Yamazaki et al. |
| 2004/0174116 A1* | 9/2004 | Lu et al. ................. 313/506 |
| 2004/0256973 A1 | 12/2004 | Imamura |
| 2006/0197080 A1 | 9/2006 | Yamazaki et al. |
| 2007/0157880 A1 | 7/2007 | Tanioka et al. |
| 2007/0202258 A1 | 8/2007 | Yamagata et al. |
| 2007/0218797 A1 | 9/2007 | Yamazaki et al. |
| 2009/0152371 A1 | 6/2009 | Stark et al. |
| 2010/0187982 A1* | 7/2010 | Hsu et al. ................. 313/504 |

FOREIGN PATENT DOCUMENTS

| | | |
|---|---|---|
| JP | 2001-345176 A | 12/2001 |
| JP | 2001-345177 A | 12/2001 |
| JP | 2001-345178 A | 12/2001 |
| JP | 2001-353454 A | 12/2001 |
| JP | 2002-75638 A | 3/2002 |
| JP | 2004-95535 A | 3/2004 |
| JP | 2004-335445 A | 11/2004 |
| JP | 2006-116491 A | 5/2006 |
| JP | 2007-229851 A | 9/2007 |
| JP | 2008-093619 A | 4/2008 |
| JP | 2009-520951 A | 5/2009 |
| WO | WO-2004/074172 A1 | 9/2004 |

* cited by examiner

ORGANIC EL ELEMENT, METHOD FOR MANUFACTURING THE SAME, AND ORGANIC EL DISPLAY DEVICE

CROSS REFERENCE TO RELATED APPLICATIONS

This is a U.S. National Phase patent application of PCT/JP2010/003899, filed Jun. 11, 2010, which claims priority to Japanese Patent Application No. 2009-157442, filed Jul. 2, 2009, each of which is hereby incorporated by reference in the present disclosure in its entirety.

TECHNICAL FIELD

The present invention relates to organic electroluminescence (EL) elements etc., and more particularly to structures of organic layers included in the organic EL elements.

BACKGROUND ART

Recently, organic EL elements have been actively developed. Display devices using organic EL elements need neither backlights nor polarizers, and have a wide dynamic range and a wide viewing angle, which is advantageous for reduction in thickness and cost. Thus, the organic EL elements have been expected to be used in next-generation display devices.

In typical organic EL elements, an organic EL layer that emits light in response to application of a voltage is provided between a thin-film like anode and a thin-film like cathode. A hole injection layer, a hole transport layer, a light emitting layer, a hole blocking layer, an electron transport layer, etc. are stacked in the organic EL layer.

These layers in the organic EL layer are often formed by vacuum deposition (a vacuum deposition method), but in some cases, are formed by coating using spin coating etc. (a coating method).

It has also been proposed to form these layers by using an electrospray (Patent Documents 1-3). For example, in an electrospray method, a solution of a coating material is directly charged so that fine particles of the solution repel each other, and the solution is sprayed from a nozzle. An electric field is formed between the nozzle and a target substrate, so that the charged droplets drop onto the substrate while being subjected to the electric field. The state of the coating material at the time the coating material drops onto the target substrate can be controlled by adjusting conditions such as the intensity of the electric field, a solvent, and the distance between the nozzle and the target substrate.

Patent Documents 1 and 2 do not mention the conditions that are used to apply the electrospray method to organic EL elements. On the other hand, in Patent Document 3, a coating material is electrostatically sprayed from a nozzle toward a conductive substrate via a mask comprised of an insulating material provided between the nozzle and the conductive substrate, so that a film is selectively formed on the conductive substrate. A voltage is applied to the mask so as to allow fine particles of the sprayed coating material to be attracted to the substrate without adhering to the mask.

In order to display a color image on organic EL display devices, three sub-pixels of red (R), green (G), and blue (B) are typically arranged in each pixel, and light emission of the sub-pixels is controlled. This method requires a light emitting layer that emits light of each color to be selectively formed in each sub-pixel (patterning).

In addition to Patent Document 3, various methods have been proposed as such a patterning technique (Patent Documents 4-7).

Patent Document 4 discloses a method in which patterning is performed by vacuum deposition using a metal mask.

Patent Document 5 discloses a method in which a hole injection/transport layer of an organic EL element is patterned by using an inkjet recording head.

Patent Document 6 discloses a method in which a mask is provided between a coating solution chamber and a substrate, and when spraying the coating solution toward the substrate, a voltage is applied to the mask to control the direction in which the coating solution moves, so that the substrate is selectively coated with the coating solution.

Patent Document 7 discloses a method in which a mask is provided between a sample board and a substrate, and when depositing a material that forms an organic EL layer, a voltage is applied to the mask to control the direction in which the material moves, so that the material is selectively deposited on the substrate.

CITATION LIST

Patent Document

PATENT DOCUMENT 1: U.S. Pat. No. 6,350,609
PATENT DOCUMENT 2: U.S. Pat. No. 6,787,313
PATENT DOCUMENT 3: Japanese Patent Publication No. 2007-229851
PATENT DOCUMENT 4: Japanese Patent Publication No. 2002-075638
PATENT DOCUMENT 5: Japanese Patent Publication No. 2000-106278
PATENT DOCUMENT 6: Japanese Patent Publication No. 2001-345176
PATENT DOCUMENT 7: Japanese Patent Publication No. 2001-345177

SUMMARY OF THE INVENTION

Technical Problem

However, the vacuum deposition method and the coating method, which are described above, and the methods of Patent Documents 3-7 relating to the patterning technique have the following problems.

(Problems of Vacuum Deposition Method)

In the case of stacking a plurality of layers by the vacuum deposition method, the deposition rate often varies between the layers. Thus, the cycle time of the manufacturing process is limited by the layer having the lowest deposition rate, which is a bottleneck to high productivity.

A resistance heating method in which a crucible is heated for deposition is commonly used in the vacuum deposition method. However, the temperature distribution inside the crucible tends to be uneven, which makes it difficult to maintain a constant deposition rate to accurately control deposition.

Moreover, in order to form a uniform film, an evaporation source need be separated from a substrate by a large distance, which unnecessarily increases the size of a vacuum deposition apparatus relative to the substrate size. As a result, a large amount of material is deposited on a portion other than the substrate, which significantly reduces the material utilization efficiency, and increases facility cost.

(Problems of Coating Method)

The coating method is widely used in the display industry, and for example, a technique of accurately forming a uniform film on a glass substrate of G8 or G10 size has been established. In organic EL elements, however, a proper stacked structure cannot be formed by the coating method for the following reason. In the organic EL elements, a plurality of layers need be stacked, and a film that has already been stacked dissolves in a solvent contained in a film that is to be stacked, unless the former film is subjected to an insolubilization treatment such as sintering.

In the case of polymer materials, it is possible to repeat coating at various levels of liquid repellency. However, since it is difficult to properly stack all the films, organic EL elements using such materials have degraded characteristics, and thus have not been ready for practical use in terms of life and efficiency.

In the case of low molecular materials, it is difficult to form films themselves by the coating method. It is difficult to obtain both solubility and improved characteristics, and the kinds of materials that can be used are limited.

(Problems of Mask Deposition Method)

In such a mask deposition method as described in Patent Document 4, a material is also deposited on the mask, and therefore only part of the material can be actually used. For example, in the case where the material is separately deposited in three sub-pixels of RGB in order to obtain color display, about two thirds of the material is discarded, and the material utilization efficiency of the mask deposition method is no more than several percent in view of the fact that the material utilization efficiency of the vacuum deposition method is around 10%.

Moreover, there is a large distance between an evaporation source and a substrate. Thus, a defective film may be formed depending on the position of the evaporation source, because deposition may be hindered by the mask. Moreover, for larger-sized display devices, the mask area need also be increased accordingly, which limits the use of this method in manufacturing of large-sized display devices.

(Problems of Inkjet Method)

In such an inkjet method as described in Patent Document 5, a film can be formed by dropping droplets of a solution onto desired positions. Thus, this method is advantageous in that patterning can be performed on demand. In the inkjet method, however, accuracy of the dropping positions of the droplets is not so high due to a mechanical displacement, clogging of a head, etc. Moreover, color mixture of RGB may occur due to scattering of the solution.

In order to form a uniform film by the inkjet method, an enclosure called a "bank" typically need be formed to contain the solution to be dropped, or a surface treatment need be performed to sufficiently increase a lyophilic property of a region where the film is to be formed. Thus, a preparatory process tends to be complicated. The surface treatment may also degrade characteristics of the film. Moreover, since films containing materials that are soluble in the same solvent cannot be directly stacked together, the kinds of materials that can be used are limited. Thus, the inkjet method has not been used for those materials and stacked structures having the best characteristics so far obtained.

(Problems of Methods of Patent Document 3 Etc.)

In the methods of Patent Document 3 and Patent Documents 6, 7, the voltage application to the mask can reduce the amount of coating material adhering to the mask, and thus can improve the material utilization efficiency.

However, separate masks need be produced according to the display devices to be manufactured, which is disadvantageous in terms of on-demand manufacturing.

It is an object of the present invention to provide an organic EL element having high material utilization efficiency and capable of being manufactured on demand.

Solution to the Problem

An organic EL element according to the present invention includes: a substrate; a pair of electrode layers formed by a lower electrode and an upper electrode; and an organic layer, wherein the organic layer is provided between the pair of electrode layers, the pair of electrode layers and the organic layer are stacked on the substrate, the organic layer includes at least one layer including a light emitting layer that emits light in response to application of a voltage, and the at least one layer included in the organic layer has a film-like structure in which fine particles are continuously bonded together.

The light emitting layer may have the film-like structure.

The organic layer may further include a second layer that functions as at least one of a charge injection layer and a charge transport layer, and the second layer may have the film-like structure.

The film-like structure may be comprised of a low molecular organic material.

The film-like structure is preferably formed by using an electrospray method.

Multiple ones of the lower electrode may be formed on the substrate, multiple ones of the light emitting layer having the film-like structure may be respectively formed on the multiple ones of the lower electrode, and two or more of the multiple ones of the light emitting layer may be formed by using an electrospray method and emit light of different colors.

Multiple ones of the lower electrode may be formed on the substrate, multiple ones of the second layer having the film-like structure may be respectively formed on the multiple ones of the lower electrode, and two or more of the multiple ones of the second layer may be formed by an electrospray method and have different thicknesses, or may be formed by the electrospray method and be comprised of different materials.

Such an organic EL element can be manufactured by using a manufacturing method including: a lower electrode formation step of forming the lower electrode on the substrate; and a film formation step of forming a film by an electrospray method, in which an electric field is formed between a spray nozzle and the substrate having the lower electrode formed thereon, and in this state, a charged coating material solution is sprayed from the spray nozzle toward the substrate, wherein a potential of the lower electrode is controlled in the film formation step.

In the case where the multiple ones of the lower electrode are formed on the substrate, the organic EL element can be formed by using a manufacturing method including a lower electrode formation step of forming the multiple ones of the lower electrode on the substrate; and a film formation step of forming a film by an electrospray method, in which an electric field is formed between a spray nozzle and the substrate having the multiple ones of the lower electrode formed thereon, and in this state, a charged coating material solution is sprayed from the spray nozzle toward the substrate, wherein the film formation step includes a potential control step of controlling a potential of each of the multiple ones of the lower electrode, and in the potential control step, a treatment is performed in which at least one of the multiple ones of the lower electrode is charged with a same polarity as that of the coating material solution.

Such an organic EL element is preferable for use in an organic EL display device.

Advantages of the Invention

According to the present invention, an organic EL element etc. can be provided which has high productivity and which is capable of reducing material cost.

BRIEF DESCRIPTION OF THE DRAWINGS

FIG. 2A shows a film formed under inappropriate conditions, and FIG. 2B shows a film formed under appropriate conditions.

DESCRIPTION OF EMBODIMENTS

Embodiments of the present invention will be described in detail below with reference to the accompanying drawings. The following description is by way of illustration only, and is not intended to limit the present invention, and its applications or uses.

(Film-Like Structure in which Fine Particles are Continuously Bonded Together)

An organic layer of an organic EL element according to the present invention includes a layer (also referred to as the "fine-particle bond film") having a film-like structure in which fine particles are continuously bonded together. Since the fine-particle bond film of the present embodiment is formed by using an electrospray method, the electrospray method will first be described.

Figure 1:
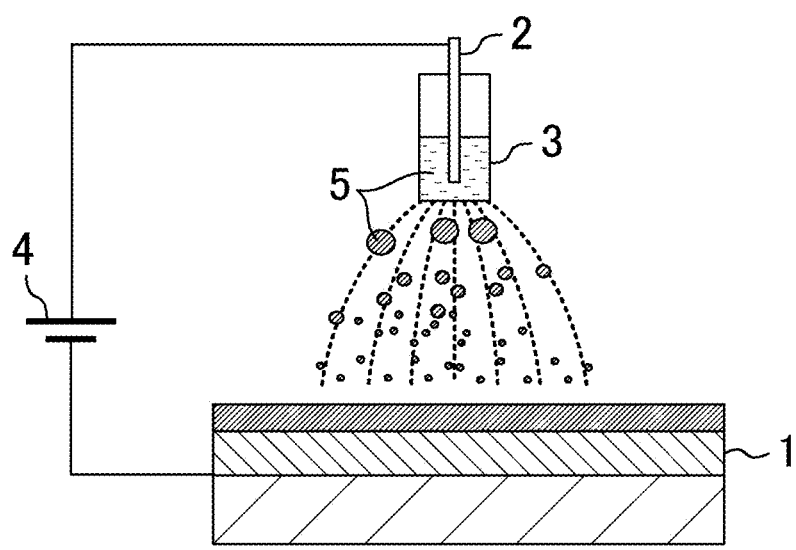
FIG. 1 is a conceptual diagram showing an example in which a film is formed by using an electrospray method according to the present invention.

FIG. 1 is a conceptual diagram of a method for forming a film by using the electrospray method. In the figure, reference character "1" represents a target object on which a film is to be formed, reference character "2" represents a solution-side electrode, reference character "3" represents a spray nozzle, reference character "4" represents a high-voltage power source, and reference character "5" represents a solution containing a coating material (also referred to as the "coating material solution" or the "coating solution").

In the electrospray method, one of a positive electrode and a negative electrode of a high-voltage power source 4 is connected to a target object 1, and the other is connected to a solution-side electrode 2 immersed in a coating solution 5. The coating solution 5 and the target object 1 are oppositely charged, and an electric field is formed between a spray nozzle 3 and the target object 1. In this state, the charged coating solution 5 is sprayed from the spray nozzle 3. Droplets of the sprayed charged solution are guided onto the target object 1 by the electric field, thereby forming a film.

At this time, since the sprayed droplets are divided into smaller droplets due to their own electrostatic force, very small droplets can be formed as compared to spraying using a common spray, or spraying by using an inkjet method. Thus, a dense film having no gap can be formed.

Figure 2A:
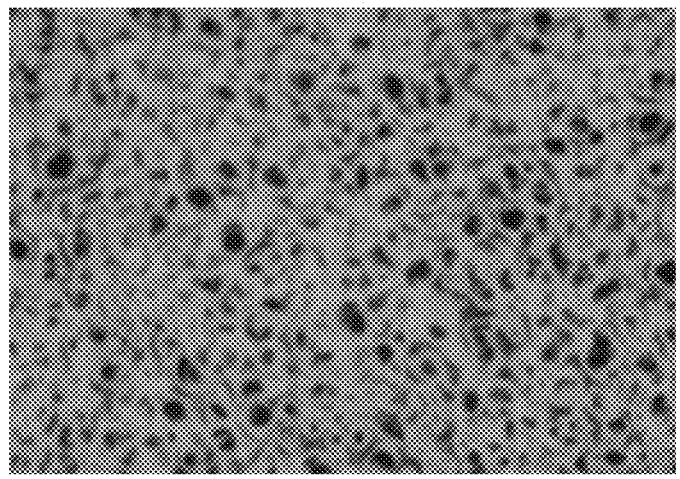
FIGS. 2A-2B show PL images of the surface of a fine-particle bond film, where
Figure 2B:
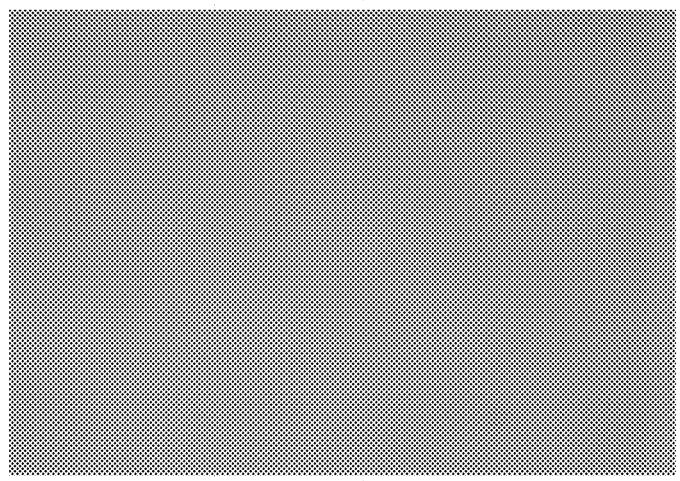

For example, FIGS. 2A-2B show photoluminescence (PL) images of a film of a light emitting pigment formed on the target object by using the electrospray method as a light emitting layer of an organic EL element. FIG. 2A shows a film formed under inappropriate conditions in which sprayed droplets are in the form of relatively large particles when reaching the target object, and FIG. 2B shows a film formed under appropriate conditions. The term "photoluminescence" or "PL" refers to a phenomenon in which a light emitting pigment is excited to emit light when irradiated with an excitation light source.

As shown in FIG. 2A, if the droplets have a large size when reaching the target object, the resultant film has portions (black spots) that do not emit light. Such a film tends to cause leakage between electrodes, and makes a flow of charges unstable.

On the other hand, as shown in FIG. 2B, uniform light emission can be obtained if the film is formed under appropriate conditions. This shows that very fine particles of the droplets are continuously connected together without any gap therebetween.

Figure 3:
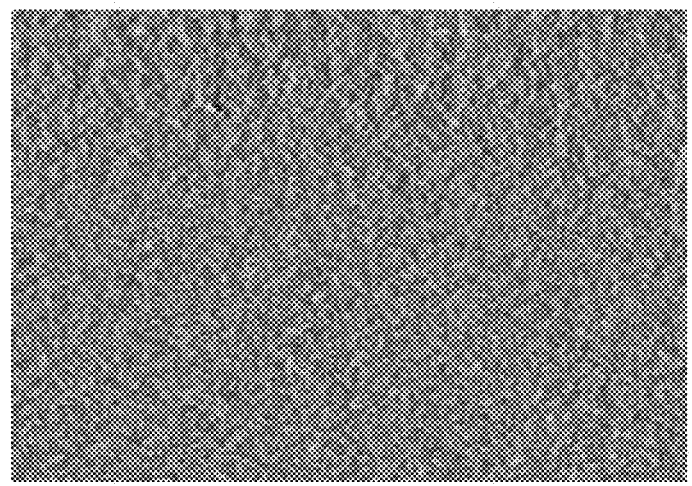
FIG. 3 shows an AFM image of the film in FIG. 2B.

For example, FIG. 3 shows an atomic force microscope (AFM) image of the film shown in FIG. 2B. In this image, fine concaves and convexes based on the droplet particles are observed on the surface of the film, although the number of such fine concaves and convexes is small. Thus, the film appropriately formed by the electrospray method has a continuous dense film structure formed by uniformly deposited fine droplet particles, even on the scale of micrometers or nanometers, and has a concavo-convex surface profile based on the droplet particles. That is, films that are formed by the electrospray method have properties of both a film and particles.

Figure 4:
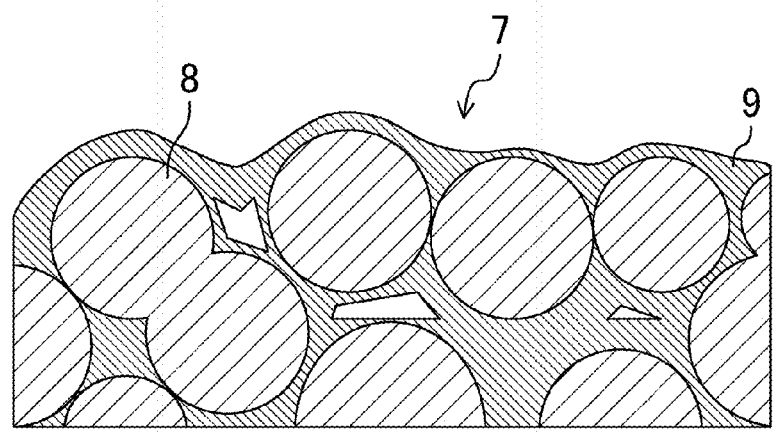
FIG. 4 is a cross-sectional view illustrating the structure of a fine-particle bond film.

Such a film is configured as shown in FIG. 4. Specifically, the droplets still contain a solvent at the time they reach the target object. Adjoining ones of the droplets that reach the target object at the same time rapidly dry while being connected together at their surface layers, thereby forming a continuous film that still has a shape of particles. In FIG. 4, reference character "7" represents this film, reference character "8" represents a particle portion (a particle core) in the film 7, and reference character "9" represents a bonding portion of the film 7, which bonds the particle cores together.

In the present invention, such a structure is defined as the "film-like structure in which fine particles are continuously bonded together."

(Use of Fine-Particle Bond Film in Organic EL Element)

Particle cores in the fine-particle bond film have a very small size on the order of nanometers. The fine-particle bond film has a relatively high density of the particle cores, and is expected to improve electrical characteristics and light emission characteristics. Since fine concaves and convexes having a size on the order of nanometers are formed on the entire surface of the fine-particle bond film, the fine-particle bond film has a substantially large surface area, and the droplets dry at a high rate. That is, the droplets dry as soon as they reach the target object. Thus, no special drying treatment is required, and the manufacturing process can be simplified.

The inkjet method often uses a high boiling-point solvent. In this case, for example, a vacuum heat treatment is required to dry the solvent, and the manufacturing process tends to become complex.

Moreover, the fine-particle bond film can be easily stacked. As described above, it is difficult to form a stacked structure by a common coating method. In the electrospray method, however, since sprayed droplets dry substantially at the same time as they reach a target object, a film can be stacked without dissolving a film located under this film.

Since the interface between the films that are in contact with each other has a large surface area, the injection effect can be enhanced.

The fine-particle bond film is also advantageous in that a low molecular compound instead of a polymer compound can be used as an organic material that forms the film. A low molecular organic material is usually formed by a vacuum deposition method. In the vacuum deposition method, the low molecular organic material is sublimated into molecules or clusters, and the molecules or clusters are deposited to form a film. In the electrospray method, a coating solution containing a low molecular organic material can be divided into droplets having substantially the same size as clusters, and the droplets can be sprayed to form a film. Thus, a film having about the same quality as a film formed by vacuum deposition can be formed by the electrospray method.

Accordingly, since the fine-particle bond film can be stacked in the electrospray method, the use of the electrospray method enables an organic EL element to be produced which is comprised of the same materials and having the same structure as a conventional organic EL element produced by the vacuum deposition method.

Individual particle cores preferably have a particle size of 100 nm or less. This is because the particle size exceeding 100 nm may produce black spots. As used herein, the term "particle size" may be, e.g., a particle size as measured from an AFM image of a film. The "particle size of 100 nm or less" means that no particle core having a particle size exceeding 100 nm is statistically contained in the film ($\alpha$=0.05).

An organic layer that is formed by using the electrospray method may be a light emitting layer, or may be a charge injection layer or a charge transport layer.

The electrospray method is performed under an electric field. Thus, a film that is formed by the electrospray method has an electrically stable structure due to the electric field, and a reliable organic EL element is obtained. For example, a film that is formed by the electrospray method has electrical orderliness if the film is comprised of an organic material having a dipole moment or electrical polarization.

Accordingly, the charge transport layer can be expected to improve electrical characteristics etc., and the light emitting layer can be expected to improve luminous efficiency etc.

(Application to Patterning)

Figure 5:
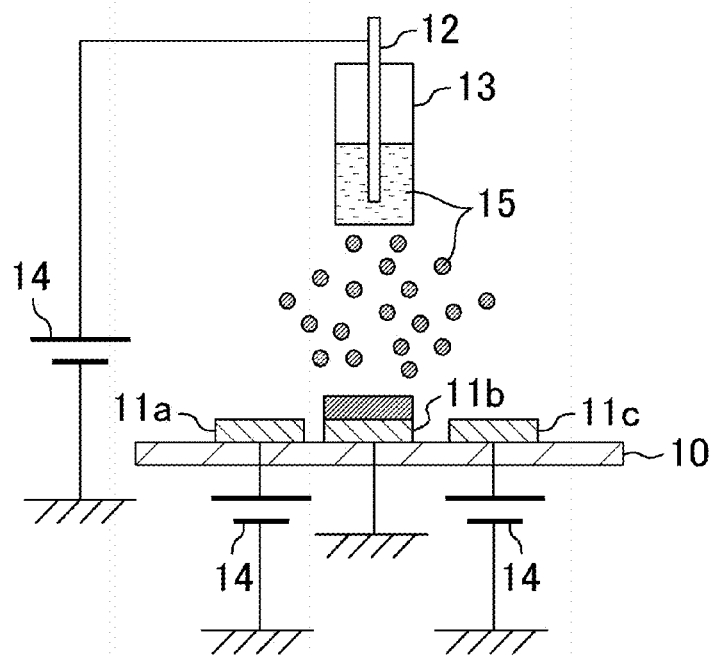
FIG. 5 is a conceptual diagram showing an example in which patterning is performed by using an electrospray method according to the present invention.

The electrospray method can be used for patterning. For example, FIG. 5 is a conceptual diagram showing an example in which patterning is performed by using the electrospray method. In FIG. 5, reference character "10" represents a substrate, reference characters "11a"-"11c" represent lower electrodes formed on the substrate. Reference character "12" represents a solution-side electrode, reference character "13" represents a spray nozzle, reference character "14" represents a high-voltage power source, and reference character "15" represents a coating solution. In this example, the solution-side electrode 12 and the lower electrodes 11a, 11c are electrically connected to a positive electrode of the high-voltage power source 14, and the lower electrode 11b is connected to a grounded negative electrode of the high-voltage power source 14.

In the electrospray method, an electric field is formed between the substrate 10 having the lower electrodes 11a-11c formed thereon and the spray nozzle 13. Thus, if the charged coating solution 15 is sprayed from the spray nozzle 13 toward the substrate 10, the charged droplets are guided and displaced by lines of electric force due to the electric field. Accordingly, a film can be formed only on any one of the lower electrodes by controlling the potentials of the lower electrodes 11a-11c.

For example, in FIG. 5, since the lower electrodes 11a, 11c are positively charged like the droplets, the lower electrodes 11a, 11c electrically repel the droplets, and the droplets do not drop onto the lower electrodes 11a, 11c. On the other hand, since the lower electrode 11b is relatively negatively charged, the droplets selectively drop onto the lower electrode 11b.

By individually controlling the potentials of the electrodes in this manner, a required electrode can be selected from the plurality of electrodes, and a film can be formed on the selected electrode.

Figure 6:
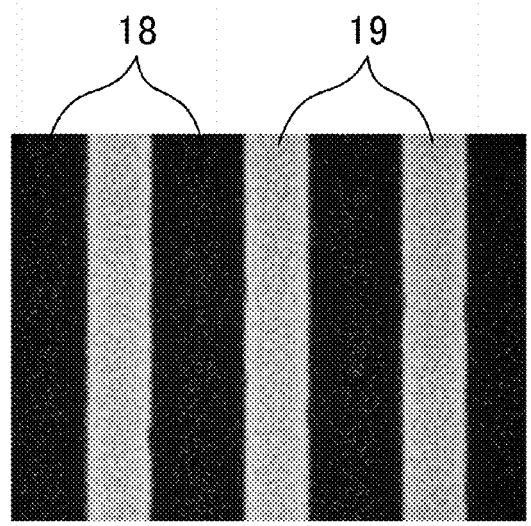
FIG. 6 shows a PL image of a patterned film of a light emitting pigment.

FIG. 6 shows a PL image of a patterned film of a light emitting pigment in this manner. In the figure, reference character "18" represents a region having no film formed thereon, and reference character "19" represents a light emitting region having a film formed thereon. The lower electrode 11b is present under the light emitting regions 19, and the lower electrode 11a or 11c is present in the regions 18 having no film formed thereon. Thus, the above method allows the film to be clearly patterned.

In order to use an organic EL element in a display device (an organic EL display device) capable of displaying a color image, the organic EL element forming a single pixel need be divided into a plurality of sub-pixels, and realistically three or more sub-pixels, and a light emitting layer need be patterned by using, for the sub-pixels, light emitting materials that emit light of different colors, such as red (R), green (G), blue (B), etc.

Thus, controlling the potentials of the lower electrodes in the above manner when forming the light emitting layer in each sub-pixel allows any light emitting layer to be formed on any one of the lower electrodes. This eliminates the need to prepare a special mask, and allows a film to be arbitrarily formed according to the surface profile of the lower electrode. Thus, the manufacturing process is simplified, and the organic EL element can be manufactured on demand.

(Improvement in Color Reproducibility)

Light emitting materials for use in organic EL elements are organic materials. Thus, the light emitting materials themselves have broad emission spectrums, and the color purity of the light emitting materials is not so high. Although color reproducibility of, e.g., 100% or more in National Television System Committee (NTSC) ratio is desired in many display applications, color reproducibility of only up to about 70% in NTSC ratio can be achieved by the emission spectrums of the main light emitting materials.

Each layer included in an organic layer has a thickness of about 10-60 nm. The overall thickness of the organic layer is typically about 100-150 nm, although the optimal thickness of the organic layer varies depending on the color. Since the layer having a thickness in this range is susceptible to interference of visible light, even a slight change in thickness greatly changes the color reproducibility of the organic layer. In other words, the color purity can be improved by adjusting the thickness of the organic layer.

That is, using the electrospray method allows organic layers to be patterned on a color-by-color basis, and thus easily allows the organic layers to have different thicknesses depending on the color. For example, the organic layers having desired thicknesses can be formed by sequentially controlling the potential on a color-by-color basis. Alternatively, the organic layers having different thicknesses can be simultaneously formed by controlling the potentials of the electrodes and adjusting the film-formation time while a series of film-formation steps are performed.

Accordingly, controlling the thicknesses of layers other than the light emitting layer included in the organic layer, such as the charge injection layer and the charge transport layer, can improve the color purity of each color, and can improve the color reproducibility of the display device.

(Implementation of Higher Efficiency and Longer Life)

Since light emitting materials that emit light of different colors usually have different bandgaps and different molecular structures, an optimal material for the charge transport layer etc. is often different depending on the light emitting material. In a conventional method, however, it is difficult to change the material of the charge transport layer etc. according to the light emitting material to pattern the charge transport layer etc., and the charge transport layer etc. is typically formed from the same material on the entire surface.

On the other hand, using the electrospray method allows patterning to be performed with short cycle time and at low cost. Thus, the charge transport layer etc. can be formed by using a material that is most suitable for the light emitting material of each light-emitting layer. This allows each sub-pixel to function effectively, and can increase the efficiency and life of the organic EL element and the display device.

First Embodiment

Figure 7:
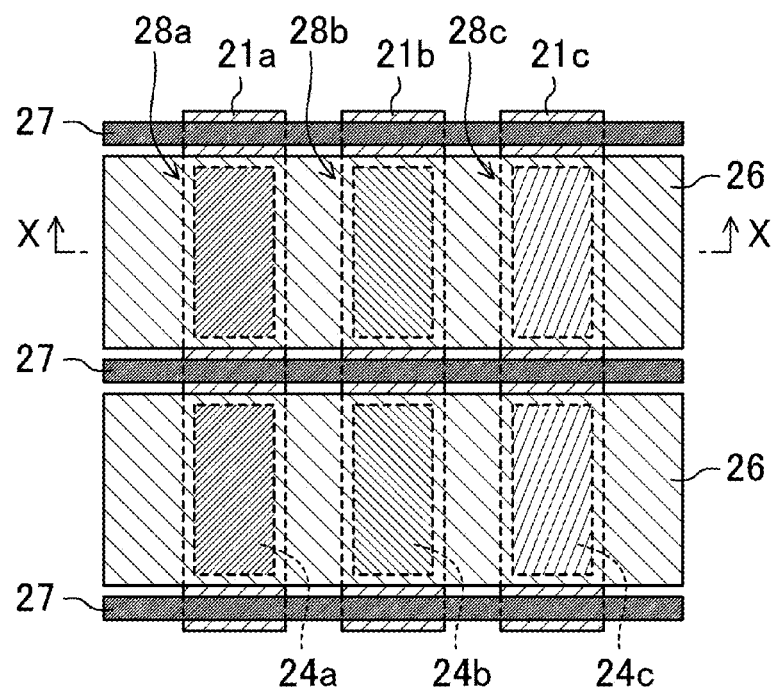
FIG. 7 is a schematic plan view of a main part of an organic EL display device according to a first embodiment.
Figure 8:
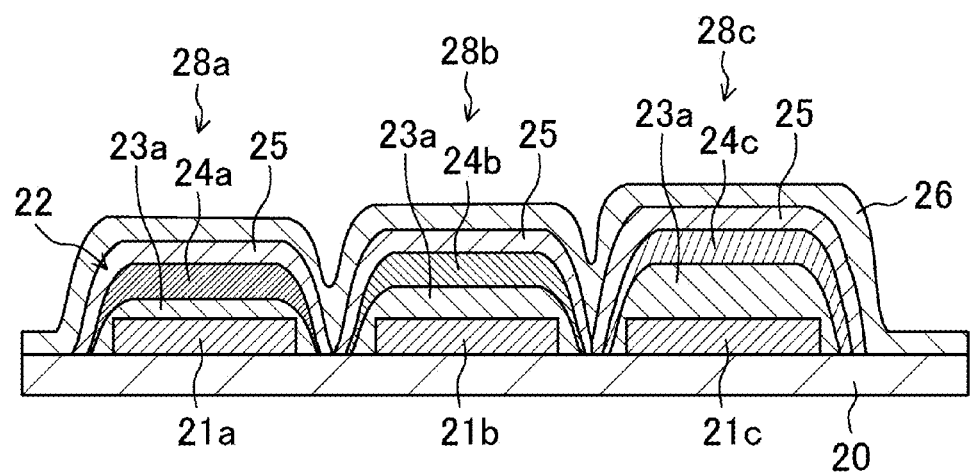
FIG. 8 is a cross-sectional view taken along line X-X in FIG. 7.
Figure 9:
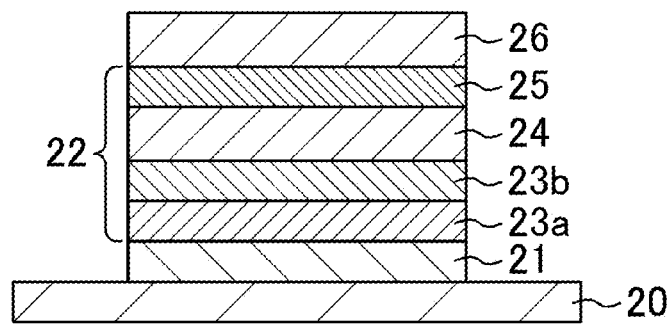
FIG. 9 is a schematic cross-sectional view showing a stacked structure of an organic EL element.

Specific embodiments will be described in detail below.
(Structure of Organic EL Element)
FIGS. 7-9 show an organic EL element that forms a display portion of a color display device (an organic EL display device) of the present embodiment. FIG. 7 is a top view of a basic structure of the organic EL element. FIG. 8 is a cross-sectional view taken along line X-X in FIG. 7. FIG. 9 shows a stacked structure of the organic EL element. In these figures, reference character "20" represents a glass substrate, reference character "21" ("21a"-"21c") represents a lower electrode (an anode), reference character "22" represents an organic layer, reference character "23a" represents a hole injection layer, reference character "23b" represents a hole transport layer, reference character "24" ("24a"-"24c") represents light emitting layer, reference character "25" represents an electron transport layer, reference character "26" represents an upper electrode (a cathode), and reference character "27" represents a spacer. FIG. 7 shows two pixel portions, and one pixel is divided into three sub-pixels 28, namely a B sub-pixel 28a, a G sub-pixel 28b, an R sub-pixel 28c.

A plurality of band-shaped anodes 21, 21, ... are formed in a stripe pattern on a glass substrate 20. The anodes 21 are arranged in parallel at predetermined intervals. These anodes 21 are comprised of transparent AL/ITO. Specifically, the width of the anodes 21 is 120 μm, and the width of the intervals is 20 μm. The anodes 21 are formed by a sputtering method and patterning by a photolithography process (the lower electrode formation step).

A plurality of linear spacers 27, 27, ... are formed to extend perpendicularly to the anodes 21. These spacers 27 are arranged in parallel at predetermined intervals. Specifically, the greatest width of each spacer 27 is 15 μm, and the width of the intervals is 340 μm. The spacers 27 are patterned by a photolithography process, and are comprised of a photosensitive polyimide resin. The spacers 27 are provided in a wall shape over the glass substrate 20 having the anodes 21 formed thereon. The width of the spacers 27 gradually increases from the side of their base ends (the side of the substrate 20) to the side of their tip ends (a reverse tapered shape). The material of the spacers 27 is not limited to the polyimide resin, and may be appropriately selected as required. For example, the spacers 27 may be comprised of an inorganic material.

A hole injection layer 23a and a hole transport layer 23b (a second layer) are formed on the anode 21. The hole transport layer 23b may be comprised of a material that is typically used in organic EL elements or organic photoconductors. Specific examples of such a material include an inorganic P-type semiconductor material, a porphyrin compound, an aromatic tertiary amine compound such as N,N'-bis-(3-methylphenyl)-N,N'-bis-(phenyl)-benzidine (TPD) or N,N'-di (naphthalene-1-yl)-N,N'-diphenyl-benzidine (NPD), a hydrazone compound, a quinacridone compound, a styrylamine compound, etc. As described in detail later, the hole injection layers 23a have different thicknesses on each sub-pixel 28, and are formed by patterning.

Light emitting layers 24 that emit light of different colors in response to voltage application are patterned on the hole transport layer 23 etc. Specifically, a light emitting layer 24a that emits blue (B) light is formed on a first anode 21a, a light emitting layer 24b that emits green (G) light is formed on a second anode 21b, and a light emitting layer 24c that emits red (R) light is formed on a third anode 21c. The light emitting layers 24 have a thickness of 30 nm.

An electron transport layer 25 having a thickness of 20 nm is formed on each light emitting layer 24. A cathode 26 is formed on the electron transport layers 25. The cathode 26 is comprised of LiF (1 nm)/MgAg (5 nm)/Al (3 nm). The cathode 26, the hole transport layer 23b, and the electron transport layers 25 in the present embodiment are formed by a vacuum deposition method so as to cover the entire surface of the pixel.

The cathode 26 etc. formed over the entire surface is divided by the spacers 27 having the reverse tapered shape. Specifically, the cathode 26 etc. is formed in a stripe pattern having a width of 330 μm. Thus, each sub-pixel 28 having a size of 120 μm by 330 μm is formed by the anode 21 and the cathode 26, which extend perpendicularly to each other. Adjoining three sub-pixels 28a-28c of RGB form one pixel.

This color display device uses a reflective electrode as the anode 21, and a semi-transparent electrode as the cathode 26, and has a top emission structure in which emitted light is output from the opposite side of the glass substrate 20. Light interference is caused between the semi-transparent electrode and the reflective electrode, whereby the emission wavelength becomes steep, and chromaticity can be improved (microcavity effect).

(Patterning of Hole Injection Layer)

The hole injection layer 23a of the present embodiment is formed by an electrospray method (the film formation step). First, a material (also referred to as the "hole injection layer material") for forming the hole injection layer was dissolved in a mixed solvent of tetrahydrofuran (THF) and xylene to produce a coating solution. A low molecular material was used as the hole injection layer material. As used herein, the term "low molecular material" refers to an oligomer such as a metal complex fluorescent material, a phosphorescent compound, or a fluorescent compound, in which fluorescent molecules are bonded with one to eight unit molecules.

Specific examples of the metal complex fluorescent material include tris(8-quinolinolato)aluminum(III) (Alq), 4,4'-bis[N-(9,9-di(6)methylfluorene-2-yl)-N-phenylamino]biphenyl (DFLDPBi), and bis(2-methyl-8-quinolinolato)(4-phenylphenolato)aluminum(III) (BAlq).

Examples of the phosphorescent compound include (acetylacetonate)bis(2,3,5-triphenylpyrazinato)iridium(III) (Ir(tppr)2(acac)), bis[2-(4',6'-difluorophenyl)pyridinato-N,C2']iridium(III)picolinato (Flrpic), tris(2-phenylpyridinato-N,C2')iridium(III) (Ir(ppy)3), bis(2-phenylpyridinato-N,C2') iridium(III)acetylacetonate (Ir(ppy)2(acac)), bis(2-phenylbenzothiazolato-N,C2')iridium(III)acetylacetonate (Ir(bt)2(acac)), tris(2-phenylquinolinato-N,C2')iridium(III) (Ir(pq)3), bis(2-phenylquinolinato-N,C2')iridium(III) acetylacetonate (Ir(pq)2(acac)), bis[2-(2'-benzo[4,5-α] thienyl)pyridinato-N,C3']iridium(III)acetylacetonate (Ir(btp)2(acac)), bis(1-phenylisoquinolinato-N,C2')iridium(III) acetylacetonate (Ir(piq)2(acac)), (acetylacetonate)bis[2,3-bis(4-fluorophenyl)quinoxalinato]iridium(III) (Ir(Fdpq)2 (acac)), and 2,3,7,8,12,13,17,18-octaethyl-21H,23H-porphyrinplatinum(II) (PtOEP).

Examples of the fluorescent compound include perylene, 2,5,8,11-tetra(tert-butyl)perylene (TPB), 4,4'-bis[2-(N-ethylcarbazole-3-yl)vinyl]biphenyl (BCzVBi), 5,12-diphenyltetracene,N,N'-dimethylquinacridone (DMQd), N,N'-diphenylquinacridone (DPQd), 4-dicyanomethylene-2-isopropyl-6-[2-(1,1,7,7-tetramethyljulolidine-9-yl)ethenyl]-4H-pyran (DCJTI), rubrene, coumarin 6, and coumarin 30.

Figure 10:
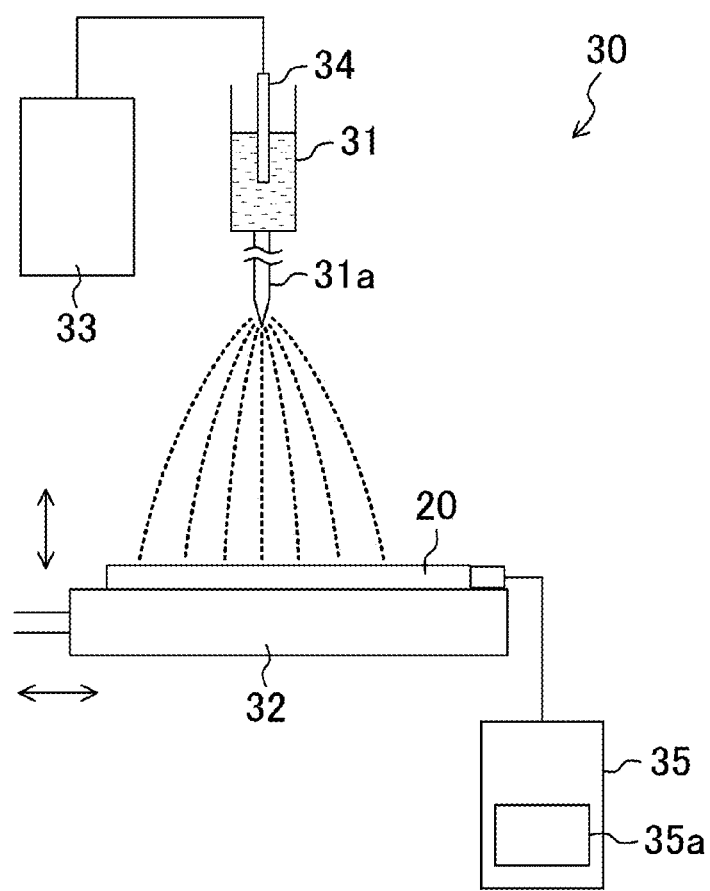
FIG. 10 is a schematic diagram of an electrospray apparatus.

FIG. 10 shows an electrospray apparatus 30 used herein. As shown in the figure, the electrospray apparatus 30 includes a spraying apparatus 31 having a capillary 31a, a stage 32 for supporting and fixing the substrate 20, a first high-voltage power source 33 configured to charge a coating solution, a coating solution-side electrode 34, a voltage control apparatus 35, etc. The voltage control apparatus 35 is provided with a second high-voltage power source 35a configured to charge each anode 21 on the substrate 20, a control system configured to control the voltage of the second high-voltage power source 35a etc. Each of the high-voltage power sources 33, 35a has an ability to form an electric field of 1 KV per centimeter. A general-purpose product produced by extending and processing a glass tube having an inner diameter of about 1 mm is used as the capillary 31a. Since droplets that are sprayed are electrically charged, and thus are divided into smaller droplets, the capillary 31a need not have such a fine nozzle hole as in the inkjet method. Thus, the electrospray method is advantageous in that clogging with a coating solution is less likely to occur.

The stage 32 is slidable in the vertical and horizontal directions so as to allow a uniform film to be formed. The substrate 20 having the anodes 21 formed thereon is placed on the upper surface of the stage 32. After the substrate 20 is placed on the stage 32, the voltage control apparatus 35 is electrically connected to a terminal portion provided at an end of each anode 21. A desired one of the anodes 21 can be selected and a voltage can be applied thereto by operating the voltage control apparatus 35 to set various conditions. Moreover, the voltage application time and the voltage application timing can be set arbitrarily.

In the present embodiment, the distance between the tip end of the capillary 31a and the substrate 20 on the stage 32 was adjusted to 5 cm. A positive electrode of the first high-voltage power source 33 is connected to the coating solution-side electrode 34, a negative electrode of the first high-voltage power source 33 is grounded, and a voltage of 5 KV is applied. That is, a voltage of +5 KV is applied to the coating solution to positively charge the coating solution.

On the other hand, each anode 21 on the substrate 20 is controlled by the voltage control apparatus 35 so as to be switched between "positively charged connection" in which the anode 21 is connected to the positive electrode of the second high-voltage power source 35a, and "negatively charged connection" in which the anode 21 is connected to the negative electrode of the second high-voltage power source 35a. The negative electrode of the second high-voltage power source 35a is grounded. If the anode 21 is connected to the positive electrode of the second high-voltage power source 35a, a voltage of +7 V is applied to the anode 21. That is, positively charged droplets do not drop onto those anodes 21 which are in the positively charged connection, but drop only onto those anodes 21 which are in the negatively charged connection, and form a film on the latter anodes 21. Although the voltage is +7 V in this embodiment, the voltage may be higher than +7 V. As shown in FIG. 8 as well, in order to most effectively produce the microcavity effect, the hole injection layer 23a having a thickness of 30 nm is formed on the first anode 21a of the B sub-pixel 28a, the hole injection layer 23a having a thickness of 60 nm is formed on the second anode 21b of the G sub-pixel 28b, and the hole injection layer 23a having a thickness of 120 nm is formed on the third anode 21c of the R sub-pixel 28c.

In order to pattern such a plurality of hole injection layers 23a having different thicknesses, the hole injection layers 23a were successively formed in the present embodiment. That is, the voltage control apparatus 35 was set so that the potential of each anode 21 is successively switched in a predetermined time when spraying the coating solution.

Figure 11:
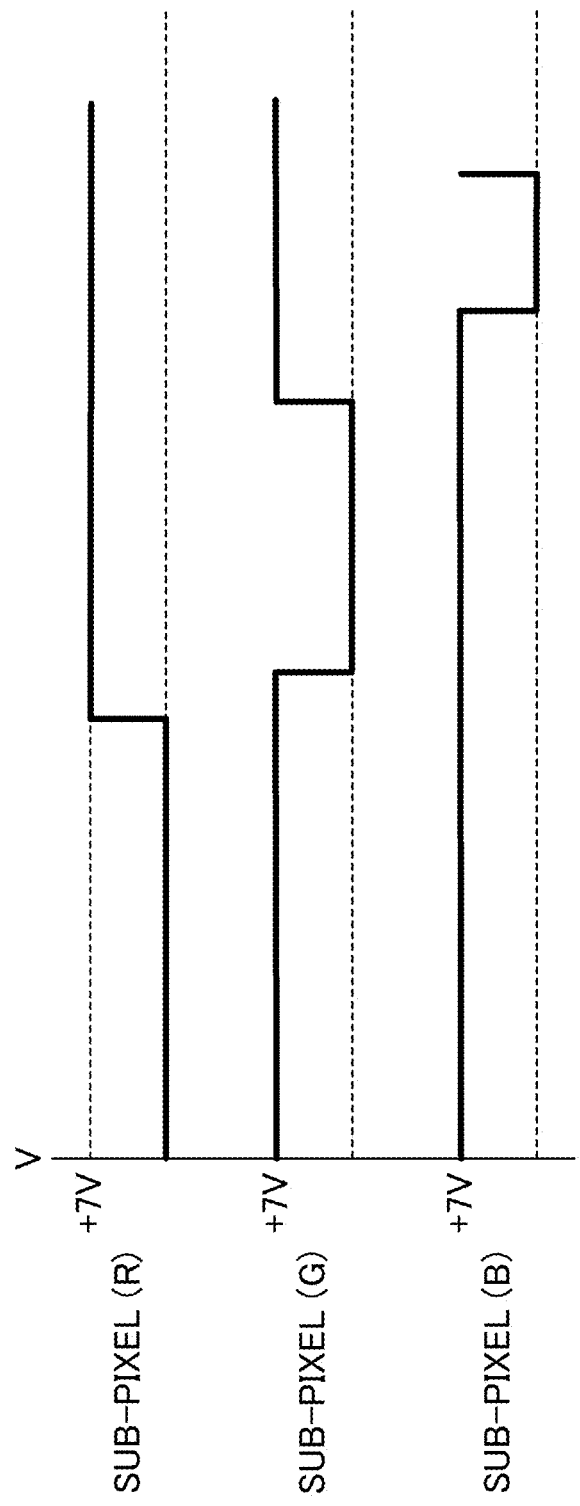
FIG. 11 is a timing chart of potential control of each sub-pixel.

FIG. 11 is a timing chart of this potential control. In the figure, the ordinate represents the voltage applied to each anode, and the abscissa represents the elapsed time. As shown in the figure, the third anode 21c is first switched to the negatively charged connection, and the first anode 21a and the second anode 21b are switched to the positively charged connection, so that a film is formed only in the R sub-pixel 28c. Then, similarly, the first to third anodes 21a-21c are sequentially switched and controlled so that a film is then formed only in the G sub-pixel 28b and so that a film is finally formed only in the B sub-pixel 28a. This method allows films having different thicknesses to be individually formed, and thus allows the film thicknesses to be adjusted with high accuracy.

After a series of treatments, the solvent in each hole injection layer 23a was almost dry, and there was no need to perform a drying treatment. Depending on the type of the hole injection layer material, it may be better to perform the drying treatment. Even in such a case, the burning temperature and the burning time can be reduced, and thus thermal damage can be reduced.

The hole transport layer 23b is formed on each hole injection layer 23a thus formed. The hole transport layer 23b may be formed by either an electrospray method or a vacuum deposition method. The electrospray method allows the hole transport layer 23b to be easily stacked without affecting the hole injection layer 23a located under the hole transport layer 23b. In the present embodiment, the hole transport layer 23b is formed by forming a film on the entire surface by the vacuum deposition method.

(Patterning of Light Emitting Layer)

Like the hole injection layers 23a, the light emitting layers 24 are also patterned by the electrospray method (the film formation step). However, a coating solution for the light emitting layers 24 is different from that for the hole injection layers 23a. That is, a light emitting material that forms the light emitting layers 24 is comprised of a mixture of a host material and a guest material (a light emitting pigment: an Ir complex in this example) that varies according to the color. The mixing ratio of each guest material to the host material is 5%. These materials were dissolved in a mixed solvent of NMP and THF to produce coating solutions.

When forming a film, different coating solutions are used for the sub-pixels 28 of each color. Thus, separate spraying apparatuses 31 were prepared for each coating solution, and the timing of voltage control was controlled to be synchronized with the timing of switching the coating solution. After the series of treatments, the solvent in each light emitting layer 24 was almost dry, and there was no need to perform a drying treatment.

The electron transport layer 25 is formed on each light emitting layer 24 thus formed. The electron transport layers 25 may be formed by either an electrospray method or a vacuum deposition method. Thereafter, the cathode 26 was formed on the electron transport layers 25 by vacuum deposition, and the stacked structure of the organic EL element was completed.

(Fine-Particle Bond Film of Present Embodiment)

An AFM image was observed in order to specifically examine the structure of each of the fine-particle bond films (the hole injection layer 23a and the light emitting layer 24) formed in the present embodiment. As a result, it was confirmed that each film was comprised of nano-sized fine particles having a particle size of about 1 to 5 nm. Adjoining ones of the nano-sized fine particles were bonded together, and the nano-sized fine particles were continuously connected together with no gap along the film surface. The nano-sized fine particles were also continuously connected together in the film thickness direction, and the fine-particle bond film had a dense structure.

(Performance of Display Device of Present Embodiment)

Comparative evaluation of the display device of the present embodiment was made regarding color purity and element characteristics.

[Color Purity]

A conventional display device had color purity of R (0.67, 0.33), G (0.30, 0.63), and B (0.15, 0.18), and an NTSC ratio of 62% for white display, whereas the display device of the present embodiment had color purity of R (0.68, 0.33), G (0.18, 0.74), and B (0.13, 0.07), and an NTSC ratio of 101% for white display.

[Element Characteristics]

A display device (a comparative example) having a similar structure was fabricated by a vacuum deposition method, and element characteristics (current efficiency and IV characteristics) of this display device were compared with those of the display device (an example) of the present embodiment.

Figure 12:
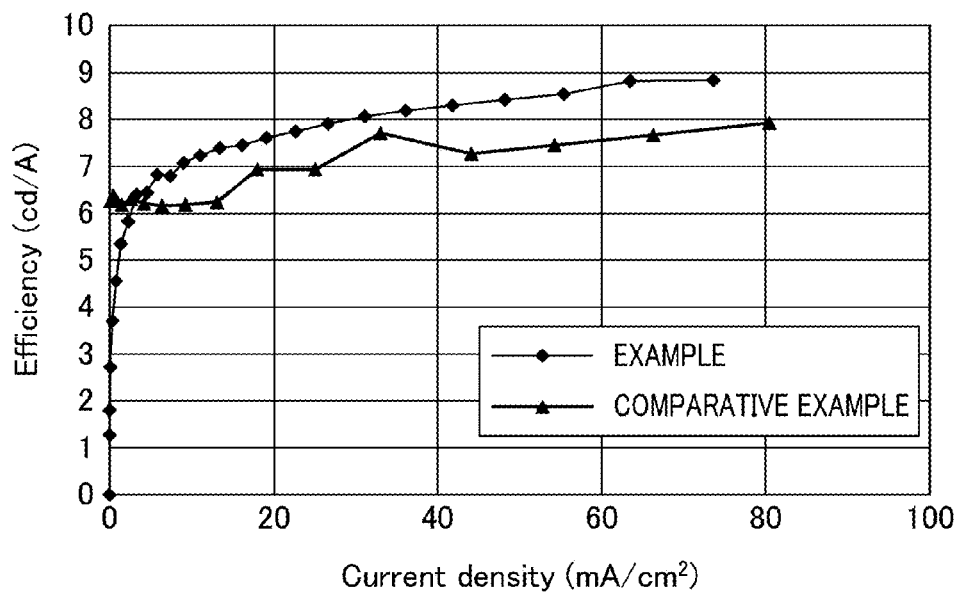
FIG. 12 is a graph showing comparison of element characteristics.
Figure 13:
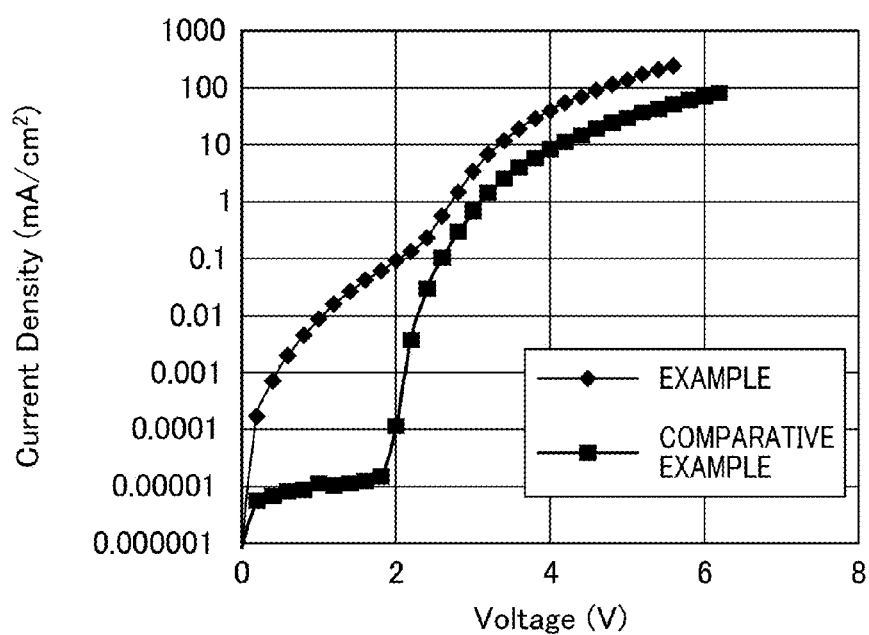
FIG. 13 is a graph showing comparison of element characteristics.

FIGS. 12-13 show the comparison results of the current efficiency of the B sub-pixels.

The results showed that the current efficiency of the example was higher than that of the comparative example by 12%, and the amount of current of the example was 1.8 times that of the example. In the other sub-pixels as well, the current efficiency of the example was higher than that of the comparative example by 12-15%, and the amount of current of the example was 1.5 to 2 times that of the example. The reason why the amount of current was increased in the example seems to be that the increased surface areas of the charge injection layer and the light emitting layer facilitated charge injection.

Moreover, since the current efficiency in the example is higher than that in the comparative example at a high current, the reason why the current efficiency was increased in the example seems to be because of facilitated charge injection, high material stability under a high electric field, and orderliness of the film.

Main modifications of the present embodiment will be described below. Since the basic configuration of these modifications is the same as that of the present embodiment, the differences between each modification and the present embodiment will be described in detail.

[First Modification]

This modification is different from the above embodiment in that the electron transport layer 25 in the B sub-pixel 28a is comprised of a material different from that of the electron transport layers 25 in the other sub-pixels 28b, 28c.

As described above, the light emitting layers 24 of each sub-pixel 28 are different from each other in bandgap, highest occupied molecular orbital (HOMO) level, and lowest unoccupied molecular orbital (LUMO) level. Thus, using the same material for the charge (hole, electron) injection layers etc. of each sub-pixel 28 is not necessarily optimal for the light emitting layers 24 of each sub-pixel 28.

The LUMO level of a light emitting material that emits blue light is higher by 0.3 eV than that of a light emitting material emitting light of other colors. Thus, electrons are not injected in a desirable manner, and a light emission voltage becomes relatively high.

Thus, in this modification, the electron transport layer 25 was patterned by using an electrospray method as in the above embodiment.

Specifically, after the light emitting layers 24 were formed, the electron transport layers 25 were first formed in the G sub-pixel 28b and the R sub-pixel 28c. Then, the electron transport layer 25 was formed in the B sub-pixel 28a by using a material different from that used for the sub-pixels 28b, 28c. In the display device thus obtained, the optimal electron transport layer 25 is formed in the B sub-pixel 28a as well. As a result, charge injection was facilitated, and the light emission voltage was able to be reduced. Moreover, since the electron transport layers 25 were also formed by the electrospray method, the drive voltage was able to be reduced by 0.2 V.

Optimal different materials may be used for the electron transport layers 25 of the R sub-pixel 28c and the G sub-pixel 28b, in addition to the B sub-pixel 28a. Similarly, different materials may be used for the hole injection layers 23a and the hole transport layers 23b, in addition to the electron transport layers 25. Moreover, a stacked structure of specific sub-pixels 28 may be changed.

[Second Modification]

In the above embodiment, the plurality of hole injection layers 23a having different thicknesses are patterned, and the patterning is controlled so as to successively form these hole injection layers 23a. However, the present invention is not limited to this, and settings of the patterning may be changed as necessary.

Figure 14A:
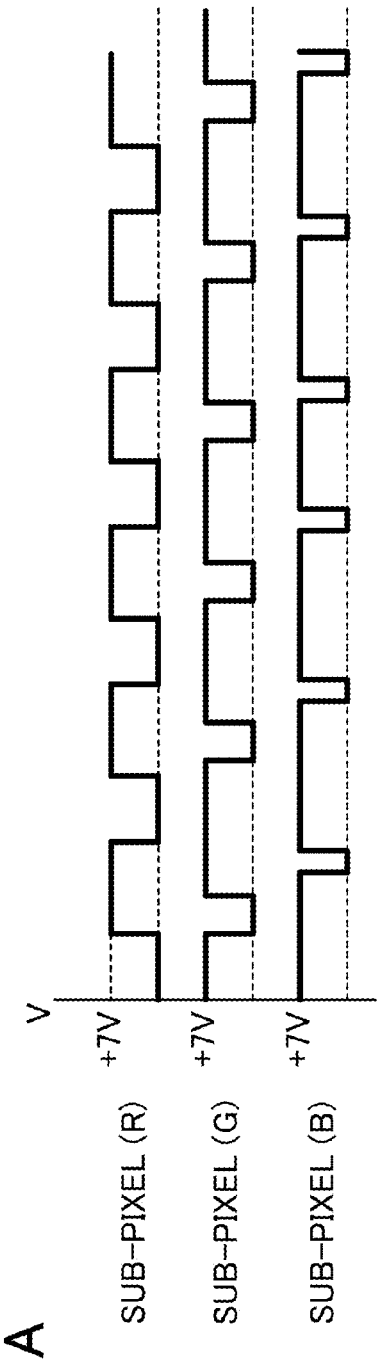
FIGS. 14A-14B show two different modifications of the timing chart of potential control of each sub-pixel.
Figure 14B:
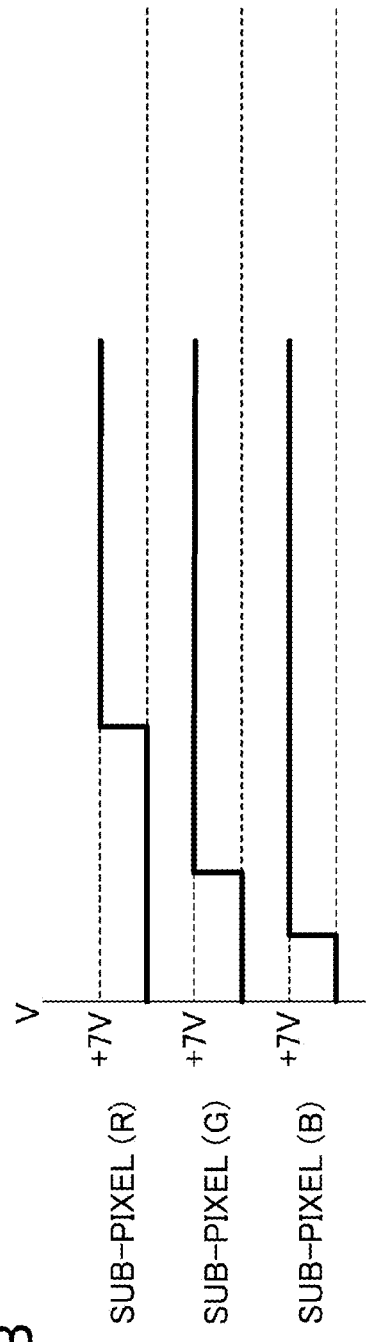

FIGS. 14A-14B show a method for simultaneously forming the hole injection layers 23a. In this method, while simultaneously forming the hole injection layers 23a, the voltage application time is controlled so as to adjust the respective thicknesses of the hole injection layers 23a.

In FIG. 14A, connection of each anode 21 is switched at a high speed to repeatedly form a part of each hole injection film 23a. The total time during which each anode 21 is in the negatively charged connection is proportional to the thickness of a corresponding one of the hole injection layers 23a. This method allows formation of all the hole injection layers 23a to be completed substantially at the same time. In FIG. 14B, formation of all the hole injection layers 23a is started at the same time, and formation of each hole injection layer 23a is terminated as soon as the thickness of that hole injection layer 23a reaches its own predetermined value. The hole injection layers 23a can be similarly formed by using either one of the methods.

[Third Modification]

In the above embodiment, a low molecular organic material is used as a material of the fine-particle bond film. However, the fine-particle bond film can be similarly formed even by using a polymeric organic material (a polymer compound).

Examples of the material of the hole injection layer 23a or the hole transport layer 23b (many polymeric organic materials have both hole injection and hole transport functions) include poly(ethylene-dioxythiophene)/poly(styrene-sulfonate) (PEDOT/PSS) and ND series products produced by NISSAN CHEMICAL INDUSTRIES, LTD.

An example of the material of the light emitting layer 24 is a polyfluorene copolymer. The polymeric organic material is a copolymer compound of a fluorene ring having alkyl chains R, R' and at least one aromatic aryl compound unit Ar (Ar'), and is represented by the following chemical formula 1.

[Chemical Formula 1]

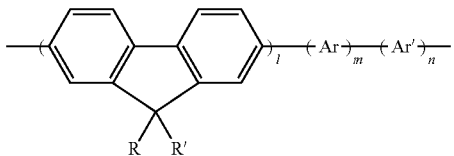

In Chemical formula 1, "R," and "R'" represent an alkyl chain, and "Ar," and "Ar'" represents an aromatic aryl compound unit, "1" and "m" represent an integer of 1 or more, and "n" represents an integer of 0 or 1 or more. Examples of the aromatic aryl compound used herein include dimethylbenzene, pyridine, benzene, anthracene, spirobifluorene, a carbazole unit, benzo amine, bipyridine, and benzothiadiazole.

Second Embodiment

An organic EL element of the present embodiment is different from the first embodiment in that films are formed on the entire surface in the present embodiment while films are patterned in the first embodiment. A light emitting element 50 including the organic EL element of the present embodiment can be mainly used as a backlight of a liquid crystal display device, or a white light source (lighting).

(Structure of Light Emitting Element)

Figure 15:
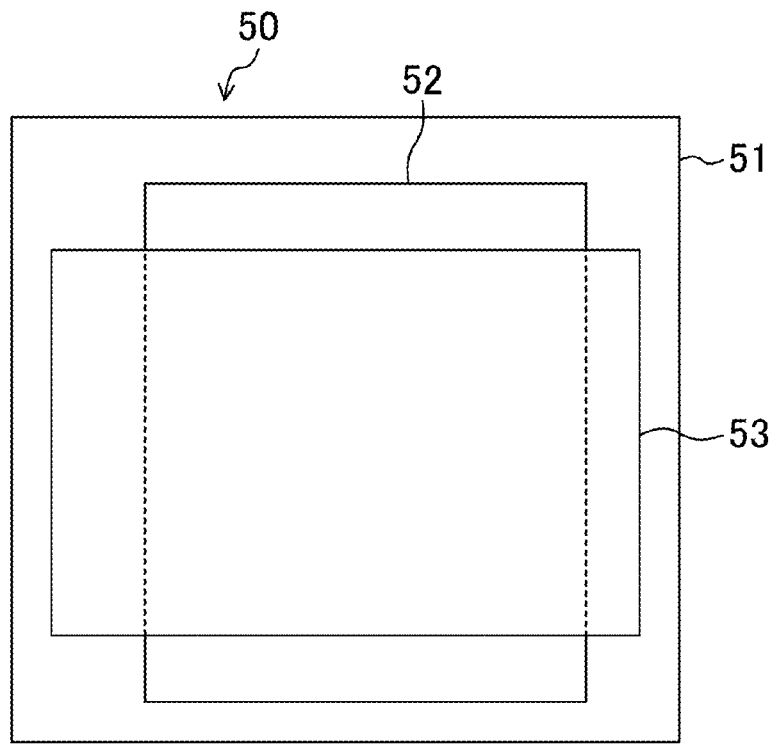
FIG. 15 is a schematic plan view of a light emitting element in a second embodiment.
Figure 16:
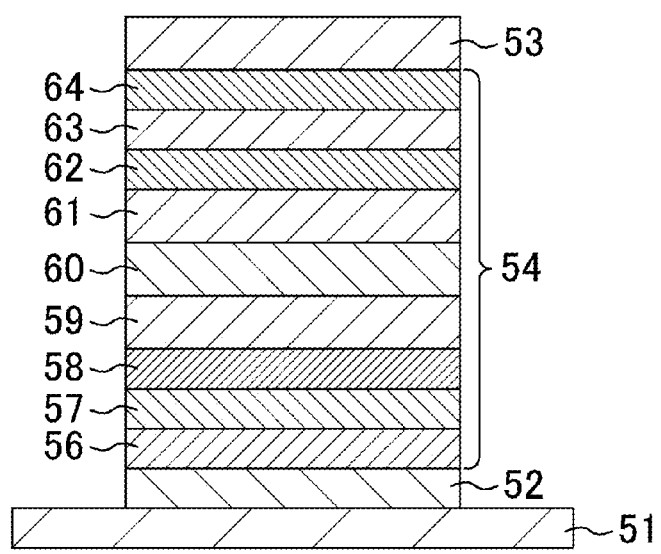
FIG. 16 is a schematic cross-sectional view showing a stacked structure of the light-emitting element in the second embodiment.

FIGS. 15-16 show the light emitting element 50 of the present embodiment. This light emitting element 50 has a bottom emission structure, and emits white light from a light emitting region provided on substantially the entire surface. It should be understood that the light emitting element 50 may emit light other than the white light, and may have a top emission structure.

In FIG. 15, reference character "51" represents a substrate, reference character "52" represents a lower electrode (an anode), and reference character "53" represents an upper electrode (a cathode). An organic layer 54 is provided between the anode 52 and the cathode 53. As shown in FIG. 16, the organic layer 54 is formed by sequentially stacking from the side of the substrate 51 a hole injection layer 56, a hole transport layer 57, an electron blocking layer 58, an R-light emitting layer 59, a G-light emitting layer 60, a B-light emitting layer 61, a hole blocking layer 62, an electron transport layer 63, and an electron injection layer 64.

The anode 52 and the cathode 53 are arranged so as to extend perpendicularly to each other. A terminal portion capable of being connected to the voltage control apparatus 35 is provided at one end of the cathode 53, and a terminal portion capable of being connected to the voltage control apparatus 35 is also provided at one end of the anode 52. The entire region where the cathode 53 and the anode 52 overlap each other in the vertical direction serves as the light emitting region.

(Manufacturing Method of Light Emitting Element 50)

An anode 52 comprised of indium tin oxide (ITO) was formed with a thickness of 150 nm on a surface of a polyethylene terephthalate (PET) film (a substrate 51) having a rectangular shape of 60 mm by 60 mm. The anode 52 was patterned by photolithography so as to have dimensions of 50 mm by 55 mm. The substrate 51 having the anode 52 formed thereon was ultrasonically cleaned for 10 minutes with, e.g., acetone or isopropyl alcohol (IPA), and then was UV-ozone cleaned for 30 minutes.

Thereafter, each layer (except the electron injection layer 64) forming the organic layer 54 was formed on the cleaned substrate 51 by an electrospray method. The electrospray method allows the layers to be uniformly formed even on the electrode that is solidly formed on the entire surface. The thickness of each layer can be controlled by the spraying time. Since the method for forming the layers by using the electrospray method is similar to that described above, description thereof will be omitted.

A material of each layer was dissolved at a respective predetermined concentration in a solvent such as chloroform, NMP, or THF to produce a coating solution for each layer. The material concentration of each coating solution is in the range of 1 to 10 wt %.

First, a hole injection layer 56 comprised of copper phthalocyanine (CuPc) was formed with a thickness of 30 nm on the anode 52. Then, a hole transport layer 57 comprised of 4'-bis-[N-(1-naphthyl)-N-phenyl-amino]biphenyl (α-NPD) was formed with a thickness of 20 nm on the hole injection layer 56. Thereafter, an electron blocking layer 58 comprised of 4,4'-bis-[N,N'-(3-tolyl)amino]-3,3'-dimethylbiphenyl (HMTPD) was formed with a thickness of 10 nm on the hole transport layer 57.

A red-light emitting layer (thickness: e.g., 20 nm, an R-light emitting layer 59) capable of transporting both holes and electrons was formed on the electron blocking layer 58. The R-light emitting layer 59 was formed by using a mixed solution as a coating solution. This mixed solution was produced by dissolving α-NPD as the material of the hole transport layer 57, 3-phenyl-4(1'-naphthyl)-5-phenyl-1,2,4-toriazol (TAZ) as the material of an electron transport layer 63, and bis(2-(2'-benzo[4,5-α]thienyl)pyridinato-N,C3')iridium (acetylacetonate) (btp2lr(acac)) as a red-light emitting dopant at a concentration ratio of 0.6:1.4:0.15. If these materials are uniformly dissolved in the mixed solution, a film can be formed which has the same composition as that of a film that is formed by a codeposition method by using these three materials.

A green-light emitting layer (thickness: e.g., 20 nm, a G-light emitting layer 60) capable of transporting both holes and electrons was formed on the R-light emitting layer 59. The G-light emitting layer 60 was also formed by using a mixed solution as a coating solution. This mixed solution was produced by dissolving α-NPD as the material of the hole transport layer 57, TAZ as the material of the electron transport layer 63, and Ir(ppy)3 as a green-light emitting dopant at a concentration ratio of 1.0:1.0:0.1.

A blue-light emitting layer (thickness: e.g., 10 nm, a B-light emitting layer 61) capable of transporting both holes and electrons was formed on the G-light emitting layer 60. The B-light emitting layer 61 was also formed by using a mixed solution as a coating solution. This mixed solution was produced by dissolving α-NPD as the material of the hole transport layer 57, TAZ as the material of the electron transport layer 63, and 2-(4'-t-butylphenyl)-5-(4"-biphenylyl)-1,3,4-oxadiazole (tBu-PBD) as a blue-light emitting dopant at a concentration ratio of 1.5:0.5:0.2. A white-light emitting layer that emits white light is obtained by these three light emitting layers 59, 60, 61.

A hole blocking layer 62 comprised of 2,9-dimethyl-4,7-diphenyl-1,10-phenanthroline (BCP) was formed with a thickness of 10 nm on the B-light emitting layer 61. An electron transport layer 63 comprised of tris(8-hydroxyquinoline)aluminum (Alq3) was formed with a thickness of 30 nm on the hole blocking layer 62.

Figure 17:
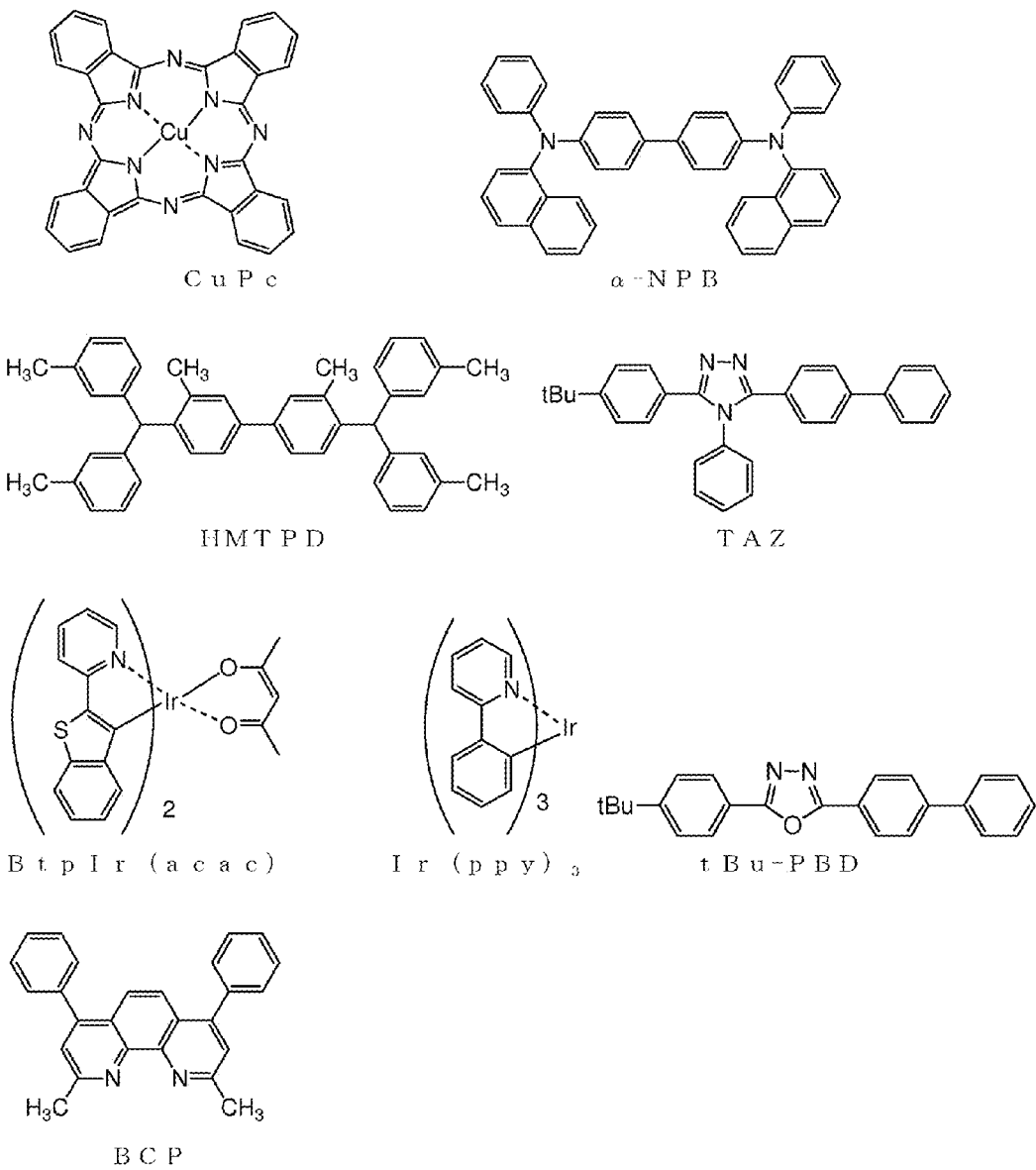
FIG. 17 is a diagram showing chemical formulas of primary materials.

An electron injection layer 64 comprised of lithium fluoride (LiF) was formed with a thickness of 1 nm on the electron transport layer 63 by a vacuum deposition method. Moreover, aluminum was deposited with a thickness of, e.g., 300 nm on the electron injection layer 64 by a vacuum deposition method to form a cathode 53. The chemical formulae of main materials are shown in FIG. 17.

(Performance of Light Emitting Element)

White light emission of 7,000 cd/m$^2$ was obtained by applying a voltage of 10 V to the completed light emitting element 50.

A light emitting element (a comparative example) having a structure similar to that of the light emitting element 50 (the example) of the present embodiment was fabricated by a vacuum deposition method, and characteristics of these light emitting elements were compared.

The comparison result showed that the luminance and the amount of current in the example was increased by 10% and 15%, respectively, at 10 V as compared to the comparative example.

Thus, even a relatively large organic EL element having a multiplicity of layers stacked on the entire surface can be easily manufactured. The electrospray method allows films to be formed in the atmosphere, and thus does not require a large-scale apparatus such as a vacuum deposition apparatus, whereby the manufacturing cost can be significantly reduced.

Moreover, the vacuum deposition method uses a codeposition method in order to form a film comprised of a mixture of a plurality of materials. However, this method requires the deposition rate of each material to be precisely controlled, which makes it difficult to stably form a film having a uniform composition. On the other hand, in the electrospray method, a film having a uniform composition can be formed by merely uniformly dissolving each material in a solution, and thus a film comprised of mixed components can be easily and stably formed.

The organic EL element of the present invention can be used in various apparatuses. For example, the organic EL element of the present invention is preferable not only for display devices for personal computers (PCs) or televisions (TVs), but also for camcorders, digital cameras, navigation systems, audio playback apparatuses (car audio systems, audio components, etc.), game machines, portable information terminals (mobile computers, mobile phones, portable game machines, electronic books, etc.). It should be understood that the organic EL element of the present invention is applicable to various lighting apparatuses.

DESCRIPTION OF REFERENCE CHARACTERS

1 Target Object
2 Solution-Side Electrode
3 Spray Nozzle
4 High-Voltage Power Source
5 Coating Solution
10 Substrate
11a-11c Lower Electrode
12 Solution-Side Electrode
13 Spray Nozzle
14 High-Voltage Power Source
15 Coating Solution
20 Glass Substrate
21 Lower Electrode (Anode)
22 Organic Layer
23a Hole Injection Layer (Second Layer)
23b Hole Transport Layer (Second Layer)
24 Light Emitting Layer
25 Electron Transport Layer
26 Upper Electrode (Cathode)
27 Spacer
28 Sub-pixel
30 Electrospray Apparatus
31 Spraying Apparatus
31a Capillary
32 Stage
33 First High-Voltage Power Source
34 Solution-Side Electrode
35 Voltage Control Apparatus
35a Second High-Voltage Power Source
50 Light Emitting Element
51 Glass Substrate
52 Lower Electrode (Anode)
53 Upper Electrode (Cathode)
54 Organic Layer
56 Hole Injection Layer
57 Hole Transport Layer
58 Electron Blocking Layer
59 R-Light Emitting Layer
60 G-Light Emitting Layer
61 B-Light Emitting Layer
62 Hole Blocking Layer
63 Electron Transport Layer
64 Electron Injection Layer

The invention claimed is:

1. An organic EL element, comprising:
a substrate;
a pair of electrode layers formed by a lower electrode and an upper electrode; and
an organic layer, wherein the organic layer is provided between the pair of electrode layers, the pair of electrode layers and the organic layer are stacked on the substrate, the organic layer includes a light emitting layer that emits light in response to application of a voltage, and at least one layer included in the organic layer has a film-like structure in which organic fine particles each having a particle core with a particle size of 100 nm or less are continuously bonded together.

2. The organic EL element of claim 1, wherein the light emitting layer has the film-like structure.

3. The organic EL element of claim 1, wherein the organic layer further includes a second layer that functions as at least one of a charge injection layer and a charge transport layer, and the second layer has the film-like structure.

4. The organic EL element of claim 1, wherein the film-like structure is comprised of a low-molecular organic material of an oligomer.

5. The organic EL element of claim 1, wherein the film-like structure is formed by drying continuously connected droplets.

6. The organic EL element of claim 2, further comprising:

multiple ones of the lower electrode formed on the substrate, multiple ones of the light emitting layer having the film-like structure respectively formed on the multiple ones of the lower electrode, and wherein two or more of the multiple ones of the light emitting layer formed by drying continuously connected droplets and emit light of different colors.

7. The organic EL element of claim 3, further comprising:

multiple ones of the lower electrode formed on the substrate, multiple ones of the second layer having the film-like structure respectively formed on the multiple ones of the lower electrode, and wherein two or more of the multiple ones of the second layer formed by drying continuously connected droplets and have different thicknesses.

8. The organic EL element of claim 3, further comprising:

multiple ones of the lower electrode formed on the substrate, multiple ones of the second layer having the film-like structure respectively formed on the multiple ones of the lower electrode, and wherein two or more of the multiple ones of the second layer formed by drying continuously connected droplets and are comprised of different materials.

9. An organic EL display device, comprising:

the organic EL element of claim 1.

* * * * *